(12) United States Patent
Kanzaki et al.

(10) Patent No.: US 8,432,096 B2
(45) Date of Patent: Apr. 30, 2013

(54) SINGLE-COLOR EL ELEMENT, SINGLE-COLOR EL BACKLIGHT, DISPLAY DEVICE, AND METHOD FOR MANUFACTURING SINGLE-COLOR EL ELEMENT

(75) Inventors: Yohsuke Kanzaki, Osaka (JP); Hirohiko Nishiki, Osaka (JP); Tohru Okabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 162 days.

(21) Appl. No.: 12/517,618

(22) PCT Filed: Jul. 26, 2007

(86) PCT No.: PCT/JP2007/064696
§ 371 (c)(1),
(2), (4) Date: Jun. 4, 2009

(87) PCT Pub. No.: WO2008/068925
PCT Pub. Date: Jun. 12, 2008

(65) Prior Publication Data
US 2010/0073910 A1    Mar. 25, 2010

(30) Foreign Application Priority Data
Dec. 5, 2006 (JP) ................................ 2006-328342

(51) Int. Cl.
*H05B 33/06* (2006.01)
(52) U.S. Cl.
USPC .......................................... 313/505; 313/500

(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 5,469,025 A * | 11/1995 | Kanemori et al. | 315/169.3 |
| 6,774,575 B2 * | 8/2004 | Sekiya | 315/169.3 |
| 2003/0122771 A1* | 7/2003 | Sumiyoshi et al. | 345/102 |
| 2004/0036410 A1* | 2/2004 | Park et al. | 313/504 |
| 2006/0006794 A1 | 1/2006 | Sakakura et al. | |
| 2006/0043406 A1 | 3/2006 | Tsubokura et al. | |
| 2007/0109465 A1 | 5/2007 | Jung et al. | |

FOREIGN PATENT DOCUMENTS

| | | |
|---|---|---|
| EP | 1 785 765 A1 | 5/2007 |
| JP | 62-287596 A | 12/1987 |
| JP | 03-081735 A | 4/1991 |
| JP | 2001-237082 A | 8/2001 |
| JP | 2005-241776 A | 9/2005 |
| JP | 2007-157418 A | 6/2007 |

OTHER PUBLICATIONS

Official Communication issued in International Patent Application No. PCT/JP2007/064696, mailed on Oct. 23, 2007.

* cited by examiner

*Primary Examiner* — Nimeshkumar Patel
*Assistant Examiner* — Christopher Raabe
(74) *Attorney, Agent, or Firm* — Keating & Bennett, LLP

(57) ABSTRACT

A single-color EL element includes a substrate; a plurality of signal wires arranged over the substrate; a plurality of pixel electrodes electrically coupled with a respective one of the plurality of signal wires via connecting wires to constitute a matrix as a whole, the plurality of pixel electrodes being separate from one another; and a single-color EL layer arranged over the plurality of pixel electrodes.

9 Claims, 5 Drawing Sheets

SINGLE-COLOR EL ELEMENT, SINGLE-COLOR EL BACKLIGHT, DISPLAY DEVICE, AND METHOD FOR MANUFACTURING SINGLE-COLOR EL ELEMENT

BACKGROUND OF THE INVENTION

1. Field of the Invention

The present invention relates to a single-color electroluminescence or EL element, a single-color EL backlight, a display device, and a method for manufacturing a single-color EL element.

2. Description of the Related Art

A display device including an EL element has been conventionally known in which a voltage is to be applied to an EL layer sandwiched between a pixel electrode and a counter electrode. If such a display device has a leak between the upper and lower electrodes due to contamination by an external substance or a pinhole formed in the EL layer, a current of a large magnitude flows at the leak point. In such a case, a sufficient voltage is not applied to the EL layer, so that the brightness of the EL element can decrease and, in a worse case, emission of light can fail.

Also, fabricating an EL element without causing a defect over a large area is difficult and, therefore, a leak repair technique is indispensable.

As an example of such a technique, Japanese Laid-Open Patent Publication No. S62-287596 discloses a display panel repair technique in which a defective portion is broken by burning with laser light.

However, when the repair is affected by disconnecting the defective portion by laser light irradiation, for example, there is a probability that one of the electrodes which is made molten by the laser light comes in contact with the other electrode, resulting in occurrence of a leak. In this case, repairing the display panel is difficult. Especially in the case of a common single-color EL element, a pair of electrodes are provided for applying a voltage to the EL layer. Thus, the single-color EL element has a disadvantage that occurrence of a leak between the electrodes due to laser light irradiation results in no emission over the entire EL element.

SUMMARY OF THE INVENTION

Preferred embodiments of the present invention repair display defects in each single pixel such that occurrence of display defect across the entire display device due to local leaks between electrodes can be satisfactorily prevented.

A single-color EL element according to a preferred embodiment of the present invention includes: a substrate; a plurality of signal wires arranged over the substrate; a plurality of pixel electrodes electrically coupled with a respective one of the plurality of signal wires via connecting wires to constitute a matrix as a whole, the plurality of pixel electrodes being separate from one another; and a single-color EL layer arranged over the plurality of pixel electrodes.

In this structure, the respective pixel electrodes are separate from one another. Therefore, when a display defect portion is detected, only a pixel electrode corresponding to the display defect portion can be repaired to eliminate the display defect. Thus, the occurrence of display defects across the entire display device due to local leaks between electrodes can be satisfactorily prevented.

In the single-color EL element according to a preferred embodiment of the present invention, the plurality of pixel electrodes may have notches in portions that extend over the connecting wires when viewed from the top.

When a display defect is repaired by irradiation with laser light, application of laser light more than necessary could lead to expansion of an insulating film of a display element toward the upper electrode side or to melting of the pixel electrode, which can cause a leak between the pixel electrode and the upper electrode. However, according to the structure of a preferred embodiment of the present invention, the plurality of pixel electrodes have notches in portions that are extending over the connecting wires when viewed from the top. Therefore, expansion of the insulating film toward the pixel electrode and melting of the pixel electrode are satisfactorily prevented even when the connecting wire is irradiated with laser light.

The single-color EL element according to a preferred embodiment of the present invention may further include at least one insulating layer between the connecting wires and the pixel electrodes.

In this structure, the insulating layer lies between a connecting wire which is to be burned by laser irradiation and a corresponding pixel electrode. Therefore, damage inflicted to the pixel electrode by laser irradiation can be decreased and minimized.

The single-color EL element according to a preferred embodiment of the present invention further includes at least one insulating layer between the connecting wires and the single-color EL layer.

In this structure, the insulating layer lies between a connecting wire which is to be burned by laser irradiation and the single-color EL layer. Therefore, damage inflicted to the single-color EL layer by laser irradiation can be decreased and minimized.

A single-color EL backlight according to another preferred embodiment of the present invention includes the above-described single-color EL element.

In this structure, the respective pixel electrodes of the single-color EL element are separate from one another. Therefore, when a display defect portion is detected, only a pixel electrode corresponding to the display defect portion can be repaired to eliminate the display defect. Thus, the occurrence of display defects across the entire display device due to local leaks between electrodes can be satisfactorily prevented.

A display device according to yet another preferred embodiment of the present invention includes: the above-described single-color EL backlight; and a display panel, wherein a pixel pitch of the single-color EL element of the single-color EL backlight is greater than a pixel pitch of the display panel by a factor of an integer.

In the backlight of the display device, the brightness sometimes greatly varies among the pixels, or a large number of display defect portions are sometimes detected. In such cases, the display element of the display panel would have variations in brightness among pixels, resulting in occurrence of moiré. However, according to the structure of a preferred embodiment of the present invention, in the single-color EL backlight, the pixel pitch of the single-color EL element is greater than the pixel pitch of the display panel by a factor of an integer. Accordingly, the difference in brightness among colors corresponding to respective pixels of the display panel is eliminated so that occurrence of moiré can be prevented.

A method for manufacturing a single-color EL element according to another preferred embodiment of the present invention includes: an element preparation step of preparing a single-color EL element which includes a substrate, a plurality of signal wires arranged over the substrate, a plurality of pixel electrodes electrically coupled with a respective one of the plurality of signal wires via connecting wires to constitute a matrix as a whole, the plurality of pixel electrodes being separate from one another, and a single-color EL layer arranged over the plurality of pixel electrodes; a defect detection step of detecting a display defect in the single-color EL layer; and a defect repair step of applying laser light to one of the connecting wires which is electrically coupled with one of the pixel electrodes corresponding to the display defect detected in the defect detection step to burn the connecting wire to be broken such that the signal wire and the pixel electrode are electrically disconnected.

In this structure, the respective pixel electrodes of the single-color EL element are separate from one another. Therefore, when a display defect portion is detected, only a pixel electrode corresponding to the display defect portion can be repaired to eliminate the display defect. Thus, the occurrence of display defects across the entire display device due to local leaks between electrodes can be satisfactorily prevented.

As described above, according to a preferred embodiment of the present invention, display defects can be repaired in each single pixel, and the occurrence of display defects across the entire display device due to local leak between electrodes can be satisfactorily prevented.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, preferred embodiments of the present invention are described in detail with reference to the drawings.

Preferred Embodiment 1

Configuration of Single-Color EL Element 10

Figure 1:
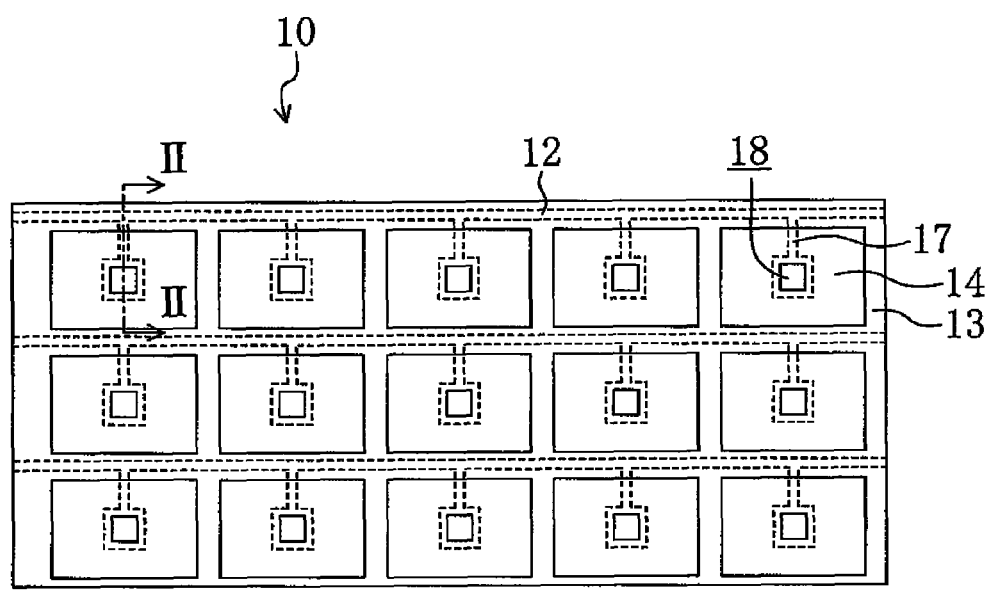
FIG. 1 is a plan view of a single-color EL element 10 according to preferred embodiment 1 of the present invention.

FIG. 1 is a plan view of a single-color EL element 10 according to preferred embodiment 1 of the present invention.

Figure 2:
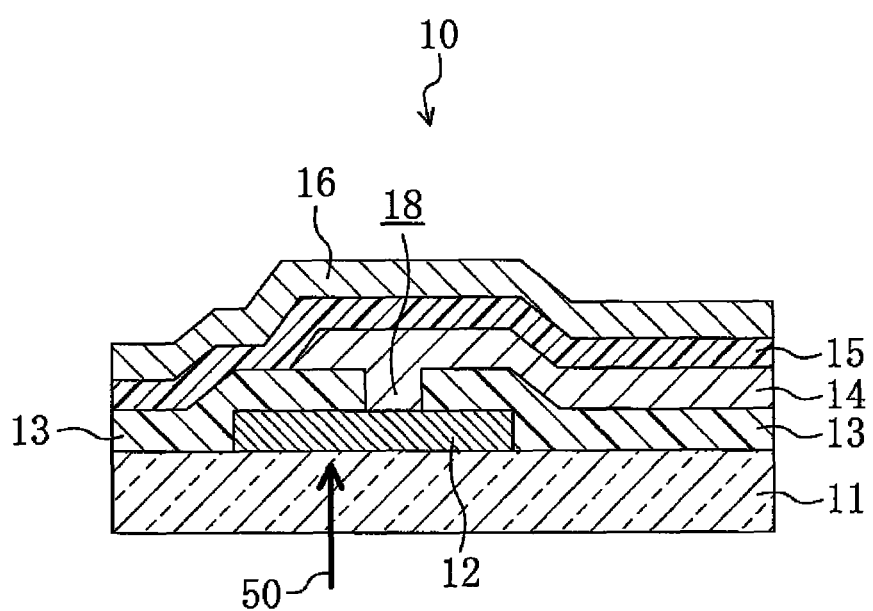
FIG. 2 is a cross-sectional view of the single-color EL element 10 of preferred embodiment 1 taken along line II-II of FIG. 1.

FIG. 2 is a cross-sectional view of the single-color EL element 10 taken along line II-II of FIG. 1.

The single-color EL element 10 of the present preferred embodiment includes, for example, an insulating substrate 11, signal wires 12, an insulating film 13, pixel electrodes 14, a single-color EL layer 15, and an upper electrode 16.

The insulating substrate 11 is formed of, for example, glass (specifically, borosilicate glass or the like). The material of the insulating substrate 11 may be any material, but it is especially preferable that the insulating substrate 11 is formed of a light-transmitting material because laser light is applied through the substrate to a connecting wire which is to be repaired.

The insulating film 13 is arranged over the insulating substrate 11. The insulating film 13 is preferably formed of, for example, a photosensitive acrylic resin, or the like.

The signal wires 12 are composed of a plurality of wires extending in parallel over the insulating film 13. The signal wires 12 are preferably formed of a two-layer metal film of, for example, titanium (Ti)/aluminum (Al). The signal wires 12 are provided with connecting wires 17 extending in a direction toward the pixel electrodes 14 when viewed from the top. The signal wires 12 and the connecting wires 17 preferably are integrally formed of the same material.

The pixel electrodes 14 constitute a matrix as a whole over the insulating substrate 11 such that each of the pixel electrodes 14 is coupled with a corresponding one of the plurality of signal wires 12 via the connecting wire 17 and that the pixel electrodes 14 are separate from one another. The pixel electrodes 14 are electrically coupled with corresponding ones of the signal wires 12 by the connecting wires 17 through contact holes formed in the insulating film 13. The pixel electrodes 14 are formed of, for example, a transparent, electrically-conductive material, such as indium tin oxide (ITO) and indium zinc oxide (IZO).

The single-color EL layer 15 is arranged over the plurality of pixel electrodes 14. Here, the single-color EL layer 15 refers to an EL layer that emits light of a single color. The light emitting layer used herein may be a monolayer or may include a plurality of layers from which light of red, blue and green, for example, are emitted so as to merge into light of a single color. The single-color EL layer 15 includes, for example, an electron transport layer, an electron injection layer, a hole transport layer, a hole injection layer, and an light emitting layer. The single-color EL layer 15 may be formed by an organic EL light emitting layer or an inorganic EL light emitting layer.

The upper electrode 16 is arranged over the single-color EL layer 15. The upper electrode 16 is formed of, for example, aluminum (Al) or silver (Ag).

Fabrication Method of Single-Color EL Element 10

Next, a fabrication method of the single-color EL element 10 according to the present preferred embodiment is described. Note that the fabrication method described below is merely an example, to which the present invention is not limited.

Firstly, a Ti/Al film is formed over the insulating substrate 11 made of glass, or the like, so as to have a thickness of about 50 nm/100 nm, for example. Formation of the Ti/Al film can be implemented by, for example, sputtering.

Then, the resultant Ti/Al film may be patterned into a predetermined shape by photolithography, for example, to form signal wires 12.

Then, for example, a photosensitive acrylic resin film is formed over the insulating substrate 11 and the signal wires 12 by spin-coating so as to have a thickness of about 2 μm, for example. The resultant film is patterned by photolithography, for example, so as to form an insulating film 13. In the patterning, contact holes 18 are formed in the insulating film 13 at positions corresponding to connecting wires.

Then, an ITO film is formed over the insulating film 13 so as to have a thickness of about 100 nm by sputtering, for example. The resultant film is patterned by, for example, photolithography to form a plurality of pixel electrodes 14 such that the pixel electrodes 14 constitute a matrix as a whole over the entire structure and are separate from one another. Here, the plurality of pixel electrodes 14 are formed so as to be coupled with corresponding ones of the connecting wires 17 through the contact holes 18 of the insulating film 13.

Then, a single-color EL layer 15 is formed over the pixel electrodes 14 and the insulating substrate 11 by vapor deposition, for example, so as to have a thickness of about 100 nm, for example.

Then, an Al film is formed over the single-color EL layer 15 by sputtering, for example, so as to have a thickness of 100 nm, for example, whereby the upper electrode 16 is formed.

Display Defect Repairing Method for the Single-Color EL Element 10

Next, a method for repairing a display defect (leak) in the single-color EL element 10 according to the present preferred embodiment is described.

First, a display defect portion in the single-color EL element 10 fabricated according to the above fabrication method is detected using, for example, a detecting device.

Then, a connecting wire 17 which is electrically coupled with a pixel electrode 14 corresponding to the display defect portion specified by the detecting device is specified.

Figure 3:
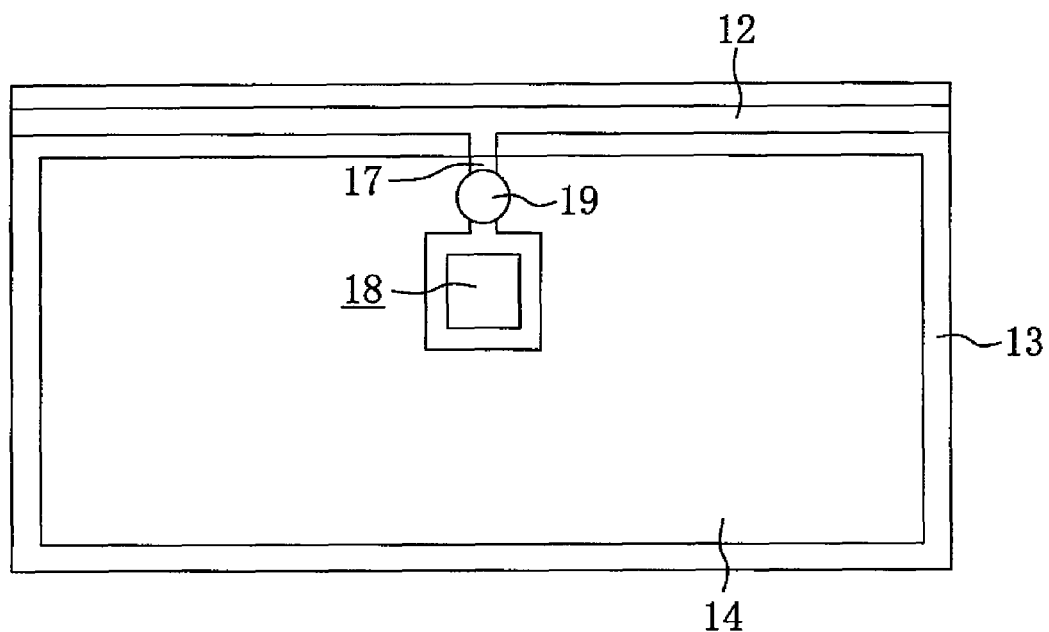
FIG. 3 is a plan view of the single-color EL element 10 of preferred embodiment 1 of the present invention, which shows a laser-irradiated portion 19.

Then, referring to FIG. 3, YAG laser light 50 at about 550 nm, for example, is applied to the specified connecting wire 17 from the back surface of the single-color EL element 10 (i.e., from the insulating substrate 11 side). The connecting wire 17 irradiated with the YAG laser light is burned to be broken at the laser-irradiated portion 19, whereby only the pixel electrode 14 corresponding to the display defect is electrically disconnected from the signal wires 12. Thus, the display defect is advantageously eliminated.

Preferred Embodiment 2

Figure 4:
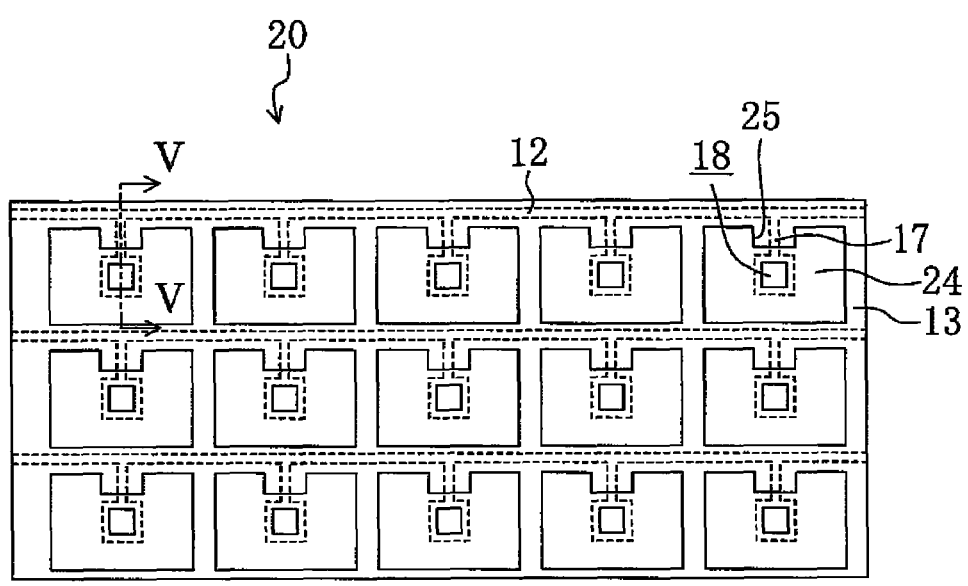
FIG. 4 is a plan view of a single-color EL element 20 according to preferred embodiment 2 of the present invention.
Figure 5:
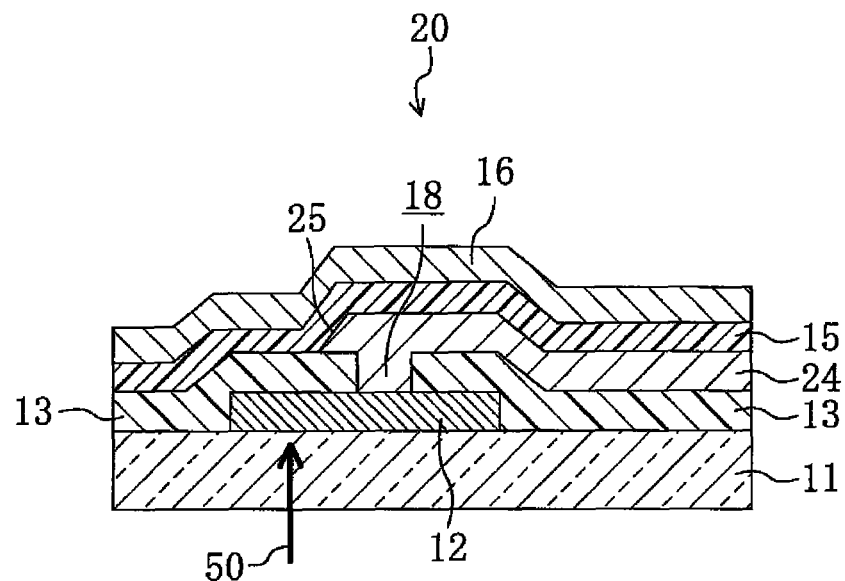
FIG. 5 is a cross-sectional view of the single-color EL element 20 taken along line V-V of FIG. 4.

FIG. 4 is a plan view of a single-color EL element 20 according to preferred embodiment 2 of the present invention. FIG. 5 is a cross-sectional view of the single-color EL element 20 taken along line V-V of FIG. 4.

The single-color EL element 20 of this preferred embodiment preferably has the same structure as the above single-color EL element 10 of preferred embodiment 1 except for the shape of the pixel electrode 24. The same fabrication method is preferably employed. Hereinafter, the same elements as those of preferred embodiment 1 are denoted by the same symbols, and the description thereof is omitted.

In the single-color EL element 20, the plurality of pixel electrodes 24 have notches 25 in portions that are extending over the connecting wires 17 when viewed from the top. The notches 25 may have any shape, for example, polygonal, circular, oval, etc. The notch 25 of the pixel electrode 24 may have such an area or shape that the pixel electrode 24 is not damaged by the laser light applied for repairing a display defect.

Figure 6:
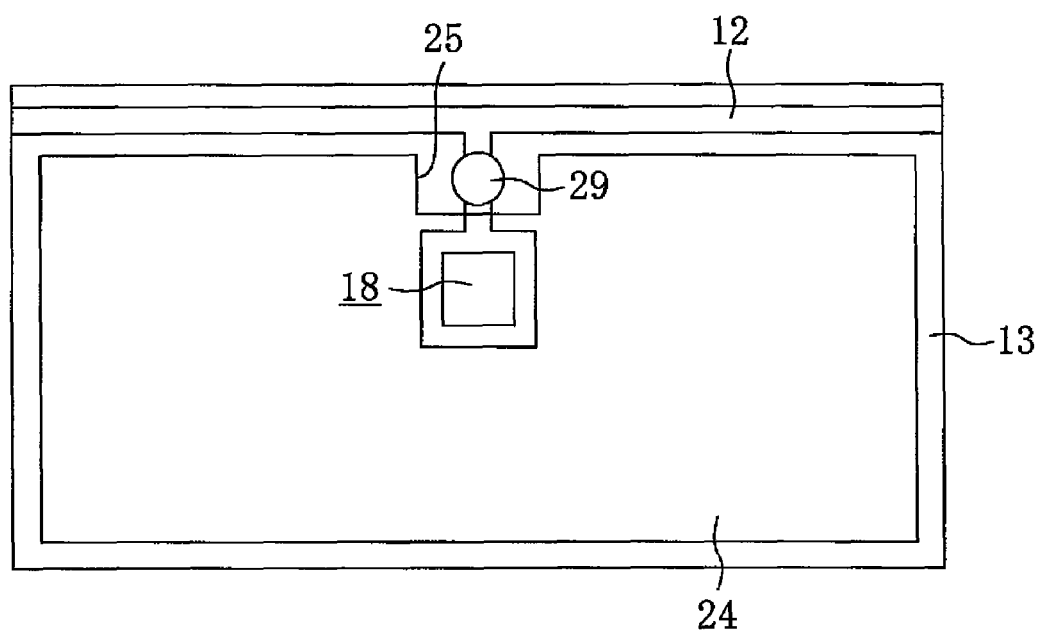
FIG. 6 is a plan view of the single-color EL element 20 of preferred embodiment 2 of the present invention, which shows a laser-irradiated portion 29.

A display defect repairing method for the single-color EL element 20 according to preferred embodiment 2 includes preparing the single-color EL element 20 and detecting a portion of display defect as does the display defect repairing method of preferred embodiment 1. Then, a connecting wire 17 which is electrically coupled with a pixel electrode 24 corresponding to the detected display defect portion is specified. Then, referring to FIG. 6, YAG laser light 50 at about 550 nm, for example, is applied to the specified connecting wire 17 from the back surface of the single-color EL element 20 (i.e., from the insulating substrate 11 side). Here, the YAG laser light 50 is applied to a position of the connecting wire 17 corresponding to the notch 25 of the pixel electrode 24. The connecting wire 17 irradiated with the YAG laser light is burned to be broken at the laser-irradiated portion 29, whereby only the pixel electrode 24 corresponding to the display defect is electrically disconnected from the signal wires 12. Thus, the display defect is advantageously eliminated.

Preferred Embodiment 3

Figure 7:
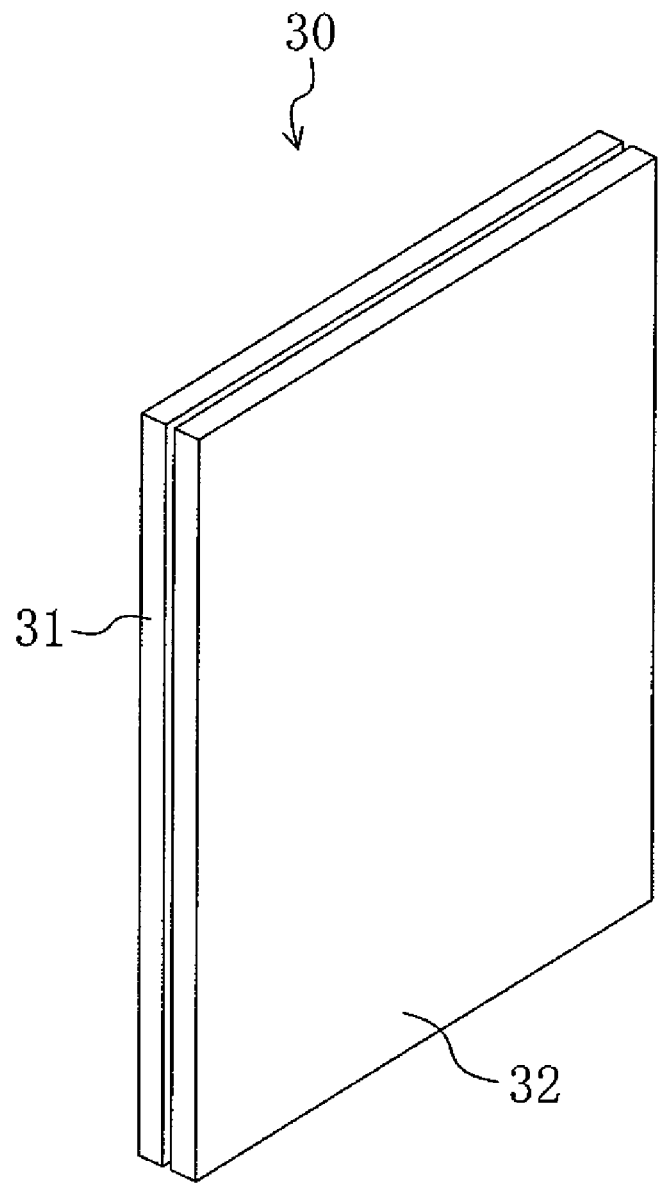
FIG. 7 is a perspective view of a liquid crystal display device 30 according to preferred embodiment 3 of the present invention.

FIG. 7 is a perspective view of a liquid crystal display device 30 according to preferred embodiment 3 of the present invention.

The liquid crystal display device 30 preferably includes a single-color EL backlight 31 which includes the single-color EL element 10 of preferred embodiment 1 and a liquid crystal display panel 32.

Figure 8:
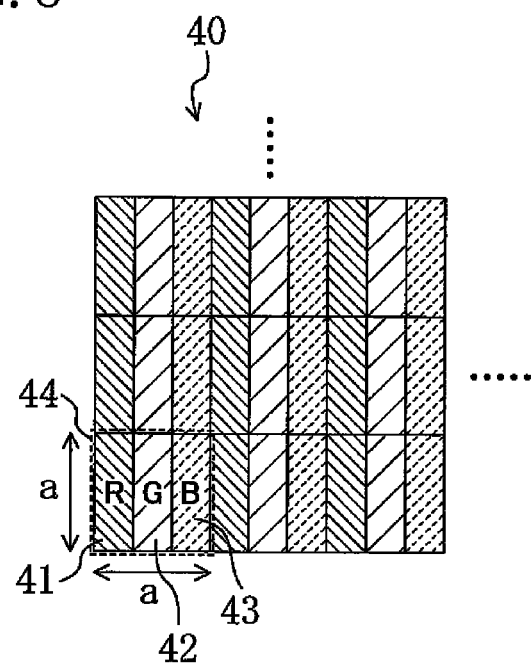
FIG. 8 is a plan view of a pixel 44 of a color filter 40.

The liquid crystal display panel 32 includes a color filter 40 in which subpixel regions of red 41, green 42 and blue 43, for example, are arranged in a matrix as shown in FIG. 8. Here, a set of one red subpixel region 41, one green subpixel regions 42 and one blue subpixel region 43 is defined as one pixel 44. In this preferred embodiment, the pixel pitch a of the liquid crystal display panel 32 preferably is about 300 μm, for example, both vertically and horizontally.

Figure 9:
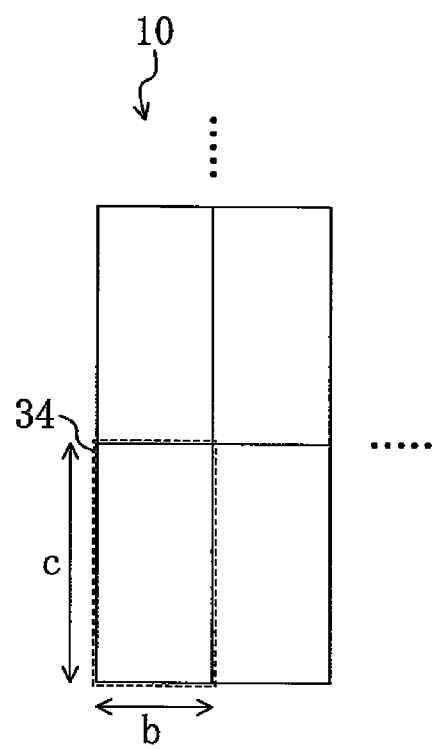
FIG. 9 is a plan view of a pixel 34 of a single-color EL backlight 31.

The single-color EL backlight 31 includes the single-color EL element 10 of preferred embodiment 1, in which the pixel pitch of a single pixel 34 is the vertical length c=600 μm·horizontal length b=300 μm as shown in FIG. 9. The vertical length c and the horizontal length b are respectively twofold and onefold relative to the pixel pitch a of the liquid crystal display panel 32.

The liquid crystal display device 30 is in the form of a module formed by laminating the liquid crystal display panel 32 and the single-color EL backlight 31, which have different pixel pitches, such that each pixel of the single-color EL backlight 31 faces two pixels of the liquid crystal display panel 32.

Note that, in preferred embodiment 3 of the present invention, the display device is described with the liquid crystal display device example, to which the present invention is not limited. Preferred embodiments of the present invention are applicable to different types of display devices.

The subpixels of the liquid crystal display panel 32 may be any other color than red, green and blue and are not limited to three colors.

The single-color EL backlight 31 may include the single-color EL element 20 of preferred embodiment 2 in place of the single-color EL element 10 of preferred embodiment 1.

Example

The single-color EL elements 10 and 20 of preferred embodiments 1 and 2 of the present invention were used, and their display defects were repaired as described in the above preferred embodiments. Here, in the single-color EL elements 10 and 20 prepared in this example, the pitch of one pixel, the vertical length c·horizontal length b, was 600 μm·300 μm, for example.

The result was such that, in the single-color EL elements 10 and 20 used in this example, pixels to be repaired were successfully disconnected without occurrence of leak between the pixel electrodes 14 or 24 and the upper electrode 16, so that the emission brightness was increased in the other pixels than the display defect portions.

The single-color EL element 10 of this preferred embodiment preferably includes an insulating substrate 11, a plurality of signal wires 12 arranged over the insulating substrate 11, a plurality of pixel electrodes 14 which are electrically coupled with corresponding ones of the signal wires 12 via connecting wires 17 and which configure a matrix as a whole, the pixel electrodes 14 being separate from one another, and a single-color EL layer 15 arranged over the plurality of pixel electrodes 14.

In this structure, the pixel electrodes 14 are separate from one another. Therefore, when a display defect portion is detected, the display defect can be repaired only in a pixel electrode 14 corresponding to the detected defect portion. Thus, the occurrence of display defects across the entire display device due to local leaks between electrodes can be satisfactorily prevented.

Preferred embodiments of the present invention are preferably useful for a single-color EL element, a single-color EL backlight, a display device and a method for manufacturing single-color EL element.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A single-color EL element, comprising:
   a substrate;
   a plurality of pixel electrodes arranged over the substrate to define a matrix as a whole, the plurality of pixel electrodes being separate from one another;
   a single-color EL layer arranged over the plurality of pixel electrodes;
   a plurality of signal wires, each of the plurality of signal wires being arranged between a corresponding pair of the plurality of pixel electrodes, the plurality of signal wires extending in parallel to each other, and each of the plurality of signal wires having a length in an extending direction that is longer than a length of a row defined by adjacent ones of the pixel electrodes in the extending direction; and
   a plurality of connecting wires providing a connection between corresponding ones of the plurality of pixel electrodes and ones of the plurality signal wires adjacent to the corresponding ones of the plurality of pixel electrodes; wherein
   at least one insulating layer is arranged between the plurality of connecting wires and the plurality of pixel electrodes; and
   the plurality of connecting wires are each directly electrically connected to a corresponding one of the plurality of signal wires, the plurality of connecting wires extending in a direction crossing the extending direction of the plurality of signal wires, and the plurality of connecting wires are each directly electrically connected to a central portion of a corresponding one of the plurality of pixel electrodes through a corresponding one of a plurality of contact holes provided in the at least one insulating layer.

2. The element of claim 1, wherein the plurality of pixel electrodes have notches in portions that extend over the connecting wires when viewed from above.

3. The element of claim 1, further comprising at least one insulating layer between the connecting wires and the single-color EL layer.

4. A single-color EL backlight comprising at least one single-color EL element of claim 1.

5. A display device, comprising:
   the single-color EL backlight of claim 4; and
   a display panel; wherein
   a pixel pitch of the single-color EL element of the single-color EL backlight is greater than a pixel pitch of the display panel by a factor of an integer.

6. A method for manufacturing a single-color EL element, comprising:
   an element preparation step of preparing a single-color EL element which includes: a substrate; a plurality of pixel electrodes defining a matrix as a whole, the plurality of pixel electrodes being separate from one another; a single color EL layer arranged over the plurality of pixel electrodes; a plurality of signal wires, each of the plurality of signal wires being arranged between a corresponding pair of the plurality of pixel electrodes the plurality of signal wires extending in parallel to each other, and each of the plurality of signal wires having a length in an extending direction that is longer than a length of a row defined by adjacent ones of the pixel electrodes in the extending direction; a plurality of connecting wires providing a connection between corresponding ones of the plurality of pixel electrodes and ones of the plurality signal wires adjacent to the corresponding ones of the plurality of pixel electrodes; and at least one insulating layer arranged between the plurality of connecting wires and the plurality of pixel electrodes; wherein the plurality of connecting wires are each directly electrically connected to a corresponding one of the plurality of signal wires, the plurality of connecting wires extending in a direction crossing the extending direction of the plurality of signal wires, and the plurality of connecting wires are each directly electrically connected to a central portion of a corresponding one of the plurality of pixel electrodes through a corresponding one of a plurality of contact holes provided in the at least one insulating layer;
   a defect detection step of detecting a display defect in the single-color EL element; and
   a defect repair step of applying laser light to one of the plurality of connecting wires which is electrically connected to one of the plurality of pixel electrodes corresponding to the display defect; wherein
   the one of the plurality of pixel electrodes that includes a defect detected in the defect detection step is burned by the laser light applied in the defect repair step to break the one of the plurality of connecting wires such that a corresponding one of the plurality of signal wires and the one of the plurality of pixel electrodes are electrically disconnected from each other.

7. A method for manufacturing a single-color EL element of claim 6, wherein
   each of the plurality of pixel electrodes includes a notch in a portion that extends over a corresponding one of the connecting wires when viewed from above; and
   the laser light is applied to a portion of one of the connecting wires that is adjacent to the notch of one of the pixel electrodes having the display defect detected in the defect detection step.

8. The element of claim 1, wherein
   the connecting wires are arranged to be integrated with the respective one of the plurality of signal wires so that each of the connecting wires protrudes from the respective one of the plurality of signal wires when seen from above in plan view.

9. A method for manufacturing a single-color EL element of claim 6, wherein
in the element preparation step, the connecting wires are arranged to be integrated with the respective one of the plurality of signal wires so that each of the connecting wires protrudes from the respective one of the plurality of signal wires when seen from above in plan view.

* * * * *